United States Patent
Schrom et al.

(10) Patent No.: US 7,602,257 B2
(45) Date of Patent: Oct. 13, 2009

(54) SIGNAL GENERATING CIRCUIT

(75) Inventors: Gerhard Schrom, Hillsboro, OR (US); Dinesh Somasekhar, Portland, OR (US); Fabrice Paillet, Hillsboro, OR (US); Peter Hazucha, Beaverton, OR (US); Sung Tae Moon, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 228 days.

(21) Appl. No.: 11/641,006

(22) Filed: Dec. 19, 2006

(65) Prior Publication Data

US 2008/0143407 A1    Jun. 19, 2008

(51) Int. Cl.
*H03B 27/00* (2006.01)

(52) U.S. Cl. ............... 331/57; 331/34; 331/74; 327/172; 327/175; 327/156; 327/161

(58) Field of Classification Search ............ 331/57, 331/34, 74; 327/156, 161, 172, 175
See application file for complete search history.

(56) References Cited

U.S. PATENT DOCUMENTS

| | | | |
|---|---|---|---|
| 6,801,026 B2 | 10/2004 | Schrom et al. | |
| 6,838,863 B2 | 1/2005 | Hazucha et al. | |
| 7,050,522 B2 * | 5/2006 | Schmatz | 375/371 |
| 2004/0120169 A1 | 6/2004 | Schrom et al. | |
| 2005/0140415 A1 | 6/2005 | Hazucha et al. | |
| 2005/0286280 A1 | 12/2005 | Schrom et al. | |
| 2006/0033553 A1 | 2/2006 | Hazucha et al. | |
| 2006/0038543 A1 | 2/2006 | Hazucha et al. | |

* cited by examiner

*Primary Examiner*—Arnold Kinkead
(74) *Attorney, Agent, or Firm*—KED & Associates, LLP

(57) ABSTRACT

A signal generating circuit is provided. The signal generating circuit may include a plurality of delay circuits coupled to provide a plurality of control signals, a weighted-sum circuit to receive the plurality of control signals and to provide an output analog signal, and a comparator circuit to compare the output analog signal with a voltage and to provide a pulse width modulated (PWM) signal based on the comparison.

23 Claims, 10 Drawing Sheets

SIGNAL GENERATING CIRCUIT

FIELD

Embodiments of the present invention may relate to a signal generating circuit.

BACKGROUND

A power converter, such as a Direct Current (DC) to DC power converter for a processor may provide output voltage control. The power converter may be driven by a signal generating circuit to provide control of the power converter.

BRIEF DESCRIPTION OF THE DRAWINGS

Embodiments of the present invention may become apparent from the following detailed description and the claims when read in connection with the accompanying drawings. The following represents brief descriptions of the drawings in which like reference numerals refer to like elements and wherein:

DETAILED DESCRIPTION

Figure 1:
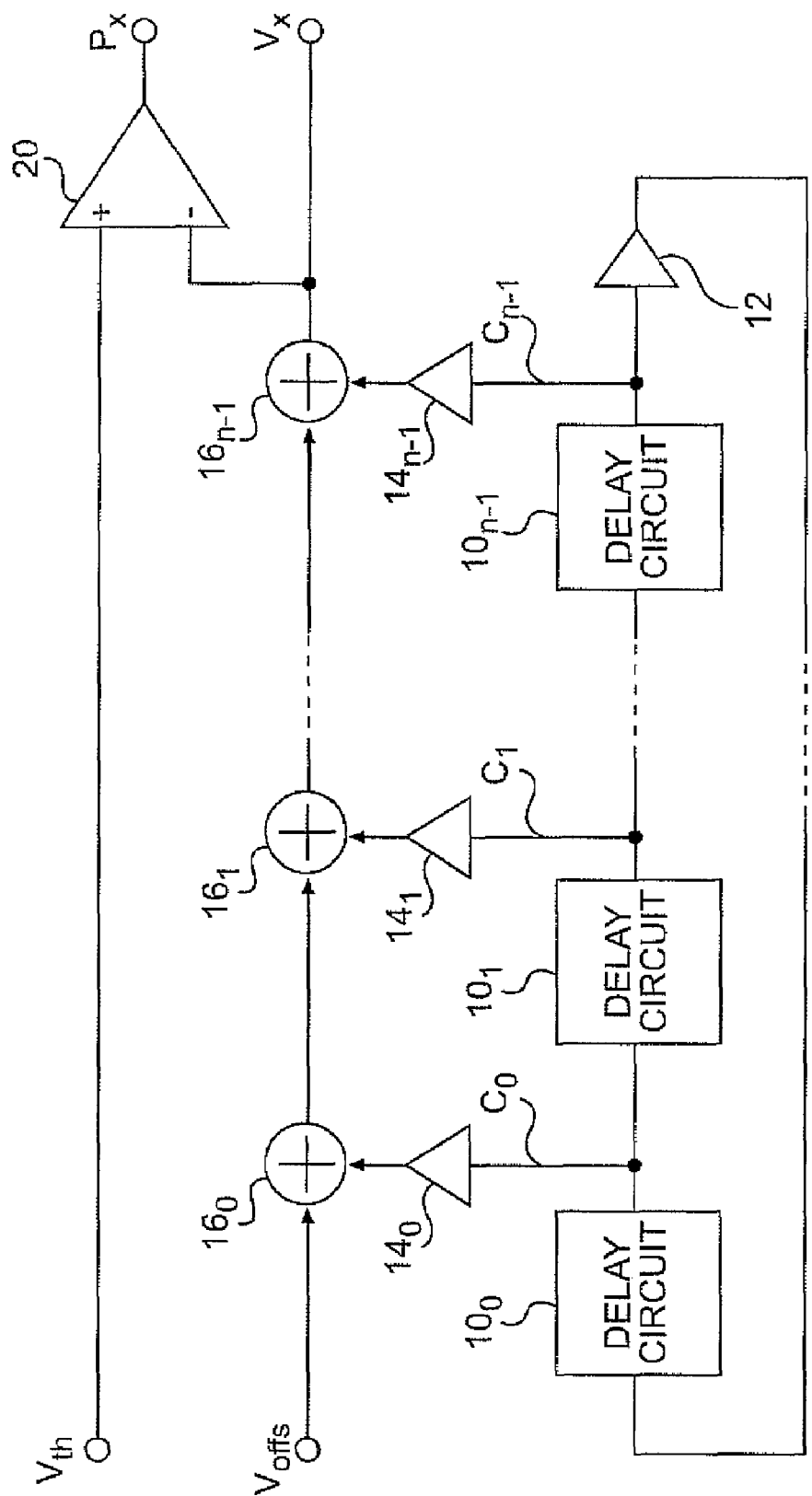
FIG. 1 shows a signal generating circuit according to an example embodiment of the present invention.

FIG. 1 shows a signal generating circuit according to an example embodiment of the present invention. Other embodiments and configurations are also within the scope of the present invention. More specifically, FIG. 1 shows a signal generating circuit that includes a ring oscillator and a weighted-sum circuit. The ring oscillator may include a plurality of delay circuits $10_0, 10_1, \ldots, 10_{n-1}$ coupled in series and with an inverting amplifier 12 coupled between an output of the delay circuit $10_{n-1}$ and an input of the delay circuit $10_0$. The delay circuits may be single bit delay cells, for example. The delay circuits may also be referred to as delay elements, delay elements or delay cells. Embodiments may also utilize a delay-locked loop (DLL) rather than a ring oscillator.

The weighted-sum circuit may include coefficient circuits $14_0, 14_1, \ldots, 14_{n-1}$ and adder circuits $16_0, 16_1, \ldots, 16_n$ arranged in different columns with each column corresponding to one of the delay circuits. The coefficient circuits may also be referred to as coefficients, multipliers and/or multiplier circuits.

The signal generating circuit may also include a comparator circuit 20 to provide an output signal, such as a pulse width modulated (PWM) signal. The signal generating circuit shown in FIG. 1 may perform a signal synthesis based on a weighted sum of ring oscillator's intermediate signals (or control signals).

Each of the delay circuits provides a separate control signal. For example, the delay circuit $10_0$ may provide a control signal $c_0$ to the coefficient circuit $14_0$, which in turn provides a signal to the adder circuit $16_0$. The delay circuit $10_1$ provides a control signal $c_1$ to the coefficient circuit $14_1$, which in turn provides a signal to the adder circuit $16_1$. Still further, the delay circuit $10_{n-1}$ provides a control signal $c_{n-1}$ to the coefficient circuit $14_{n-1}$, which in turn provides a signal to the adder circuit $16_{n-1}$. Additional delay circuits, coefficient circuits and adder circuits are not shown in FIG. 1 but may also be provided.

The adder circuit $16_0$ adds the signal received from the coefficient circuit $14_0$ with an offset voltage ($V_{offs}$) (or offset voltage signal) and provides a signal to the adder circuit $16_1$. The adder circuit $16_1$ adds the signal received from the adder circuit $16_0$ with the signal received from the coefficient circuit $14_1$ and provides a signal to the next adder circuit (such as the adder circuit $16_{n-1}$). Still further, the adder circuit $16_{n-1}$ adds the signal received from the previous adder circuit (such as the adder circuit $16_1$) with the signal received from the coefficient circuit $14_{n-1}$ and provides an output analog signal Vx (or output waveform). The output analog signal Vx is therefore based on the offset voltage $V_{offs}$ and a sum of outputs from the adder circuits $16_0, 16_1, \ldots, 16_{n-1}$. The output analog signal Vx is a periodic waveform.

The comparator circuit 20 receives a threshold voltage $V_{th}$ (or threshold voltage signal) at a positive input terminal and receives the output analog signal $V_x$ from the adder circuit $16_{n-1}$ at a negative input terminal. The comparator circuit 20 provides the pulse width modulated (PWM) signal based on the comparison of the input signals to the comparator circuit 20. The PWM signal may be applied to a power converter, for example. The power converter may use the PWM signal, for example, to control power switching transistors.

The signal generating circuit shown in FIG. 1 may generate a plurality of different output analog signals (or output waveforms) based on values of the coefficient circuits. For example, the signal generating circuit may generate a periodic sinusoidal signal as the output analog signal $V_x$ if coefficients of each of the coefficient circuits $14_0, 14_1, \ldots 14_{n-1}$ are $\sin(k\pi/(n))$, where k represents a positive integer in the range of 0 to n-1. On the other hand, the signal generating circuit may generate a periodic triangular signal as the output analog signal $V_x$ if the coefficients of each of the coefficient circuits $14_0, 14_1, \ldots 14_{n-1}$ are a constant value.

A duty cycle of the PWM signal Px may depend on a shape and amplitude of the output analog signal $V_x$ and the threshold voltage $V_{th}$. For example, when coefficients of the coefficient circuits are A/n=constant, then the output analog signal $V_x$ may be a periodic triangular signal having a peak-to-peak amplitude of A. The duty cycle D of the resulting PWM signal Px may be $D=(V_{th}-V_{offs})/A$. The duty cycle of the PWM signal $P_x$ may also be altered by increasing or decreasing the offset voltage $V_{offs}$.

The signal generating circuit of FIG. 1 may generate different types of analog signals and pulse width modulated (PWM) signals. The PWM signals may be applied to a power converter, for example.

Figure 2:
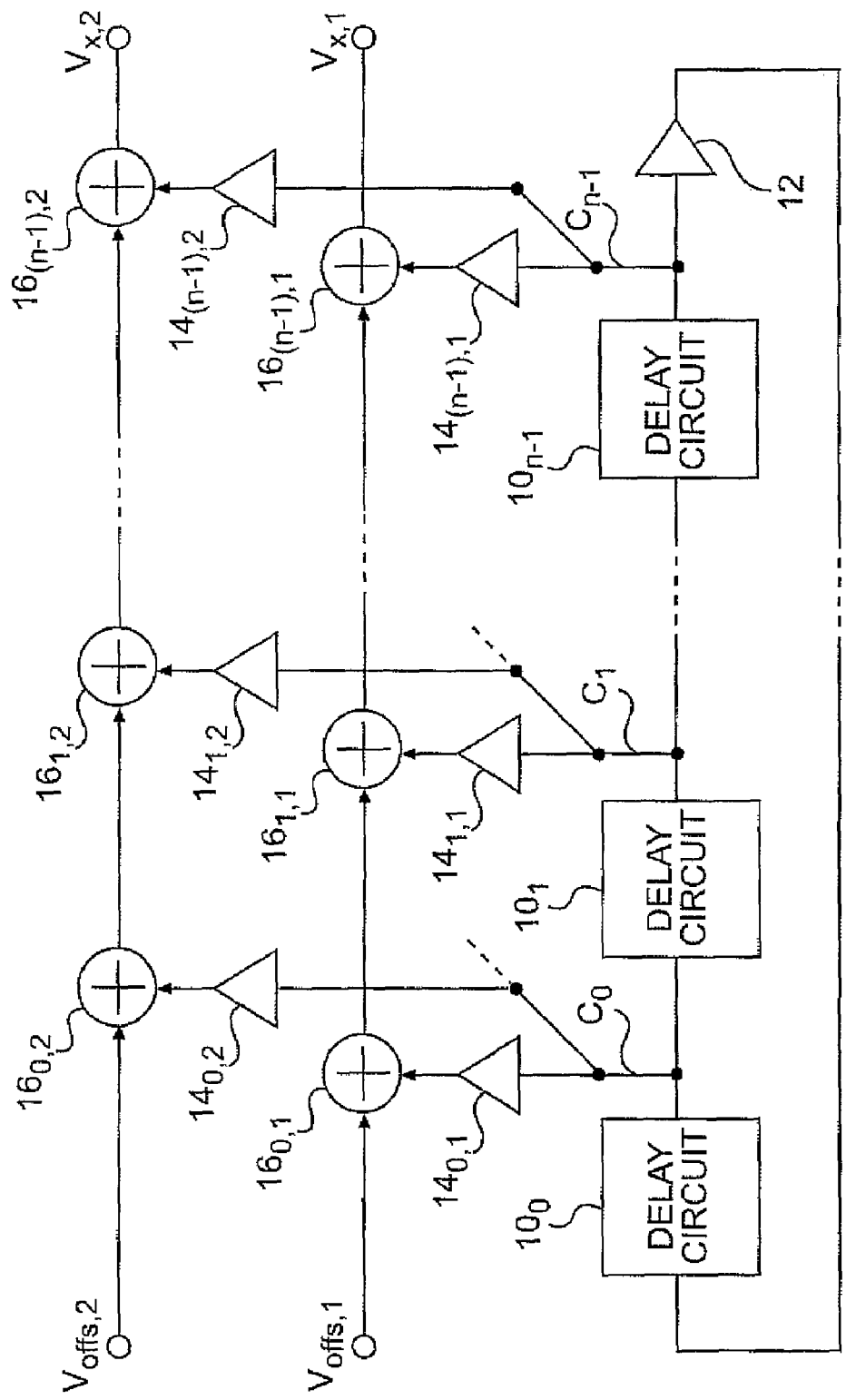
FIG. 2 shows a signal generating circuit according to an example embodiment of the present invention.

FIG. 2 shows a signal generating circuit according to an example embodiment of the present invention. Other embodiments and configurations are also within the scope of the present invention. More specifically, FIG. 2 shows two weighted-sum circuits, namely a first weighted-sum circuit and a second weighted-sum circuit.

The first weighted-sum circuit may output a first output analog signal $V_{x,1}$ and the second weighted-sum circuit may output a second output analog signal $V_{x,2}$. In one example, the second output analog signal $V_{x,2}$ may be phase-shifted from the first output analog signal $V_{x,1}$. In another example, the second output analog signal $V_{x,2}$ may be a different type of signal than the first output analog signal $V_{x,1}$.

The first weighted-sum circuit may correspond to the weighted-sum circuit of FIG. 1 by including the coefficient circuits $14_{0,1}$, $14_{1,1}$ ... $14_{(n-1),1}$ as well as the adder circuits $16_{0,1}$, $16_{1,1}$ ... $16_{(n-1),1}$. The first weighted-sum circuit may generate the first output analog signal $V_{x,1}$.

The second weighted-sum circuit may include coefficient circuits $14_{0,2}$, $14_{1,2}$, ..., $14_{(n-1),2}$ and adder circuits $16_{0,2}$, $16_{1,2}$, ..., $16_{(n-1),2}$ that generate the second output analog signal $V_{x,2}$. For example, the coefficient circuit $14_{0,2}$ may receive the control signal $c_o$ from the delay circuit $10_o$ and provide a signal to the adder circuit $16_{0,2}$. Similarly, the coefficient circuit $14_{1,2}$ receives the control signal $c_1$ from the delay circuit $10_1$ and provides a signal to the adder circuit $16_{1,2}$. Still further, the coefficient circuit $14_{(n-1),2}$ receives the control signal $c_{n-1}$ from the delay circuit $10_{(n-1)}$ and provides a signal to the adder circuit $16_{(n-1),2}$.

The adder circuit $16_{0,2}$ adds the signal received from the coefficient circuit $14_{0,2}$ with the offset voltage ($V_{off,2}$) (or offset voltage signal) and provides a signal to the adder circuit $16_{1,2}$. The adder circuit $16_{1,2}$ adds the signal received from the adder circuit $16_{0,2}$ with the signal from the coefficient circuit $14_{1,2}$ and provides a signal to the next adder circuit (such as the adder circuit $16_{(n-1),2}$). Still further, the adder circuit $16_{(n-1),2}$ adds the signal received from the previous adder circuit (such as the adder circuit $16_{1,2}$) with the signal from the coefficient circuit $14_{(n-1),2}$ and provides the output analog signal $V_{x,2}$. The output analog signal $V_{x,2}$ is based on the offset voltage $V_{offs,2}$ and a sum of outputs of the adder circuits $16_{0,2}$, $16_{1,2}$, ..., $16_{(n-1),2}$.

Accordingly, the signal generating circuit shown in FIG. 2 uses two weighted-sum circuits to generate two signals (e.g. two phase-shifted signals). Other numbers of weighted-sum circuits are also within the scope of the present invention. In another example, the signal generating circuit shown in FIG. 2 may also produce two different types of signals, such as a triangular waveform signal for the first weighted-sum circuit and a sinusoidal waveform signal for the second weighted-sum circuit. In order to obtain the different types of signals, the coefficient circuits for the first weighted-sum circuits may be different than the coefficient circuits for the second weighted-sum circuit.

A comparator circuit (such as the comparator circuit 20 shown in FIG. 1) may be coupled to the output of the adder circuits $16_{(n-1),1}$ to generate a first PWM signal, and a comparator circuit (such as the comparator circuit 20 shown in FIG. 1) may be coupled to the output of the adder circuit $16_{(n-1),2}$ to generate a second PWM signal. The second PWM signal may be phase-shifted from the first PWM signal. The comparator circuits are not shown in FIG. 2 for ease of illustration.

Figure 3:
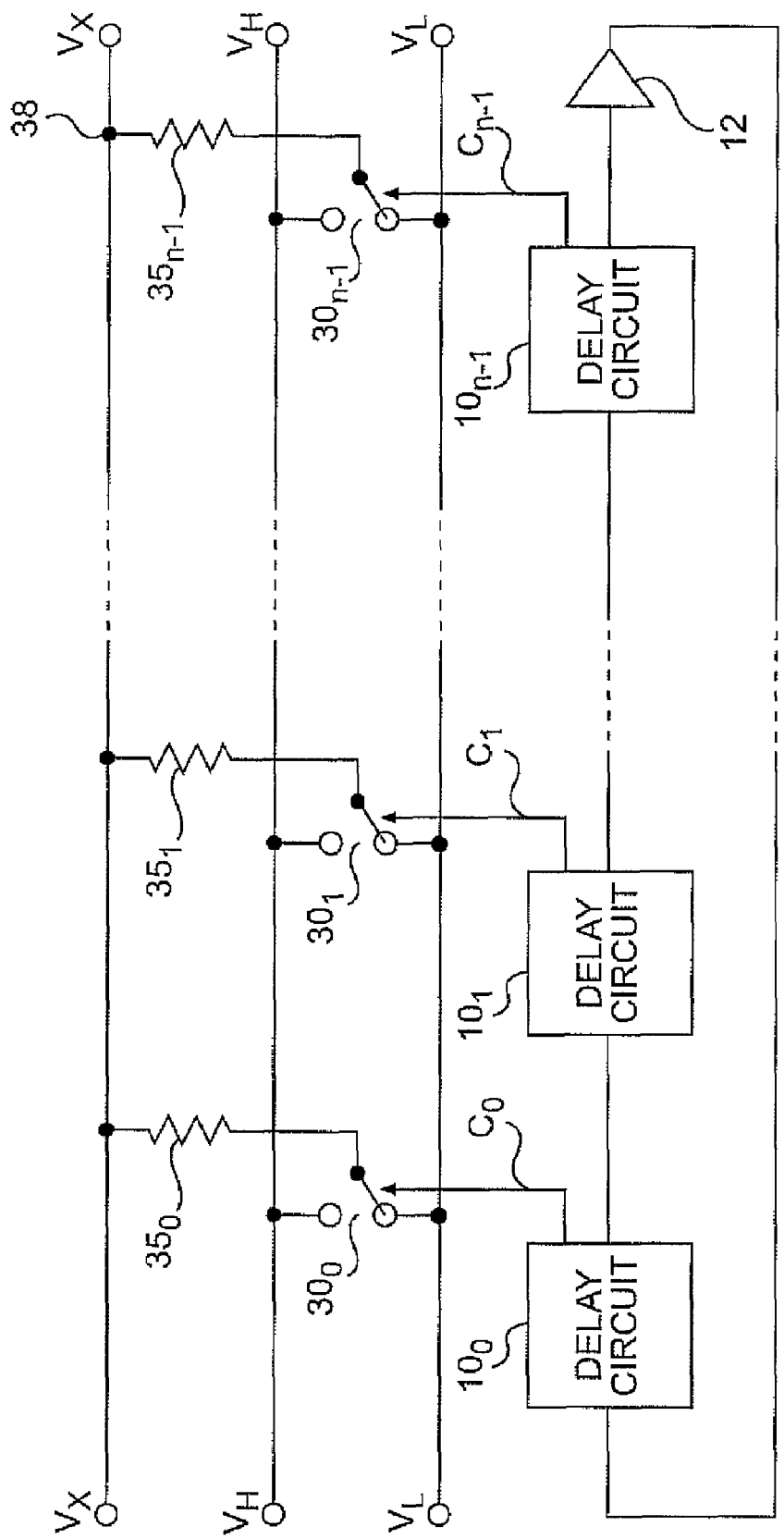
FIG. 3 shows a signal generating circuit according to an example embodiment of the present invention.

FIG. 3 is a signal generating circuit according to an example embodiment of the present invention. Other embodiments and configurations are also within the scope of the present invention. More specifically, FIG. 3 shows a weighted-sum circuit that includes switch-resistor implementations. The switch-resistor implementations may correspond to the coefficients and adders discussed above with respect to FIG. 1.

In FIG. 3, the weighted-sum circuit includes switches $30_0$, $30_1$, ..., $30_{n-1}$ and resistors $35_0$, $35_1$, ..., $35_{n-1}$ are coupled together to form a plurality of switch-resistor implementations. For example, the switch $30_0$ may be coupled at one end to the resistor $35_0$ and may switch between voltage $V_H$ or voltage $V_L$ based on the control signal $c_0$. For example, if the control signal $c_0$ is HIGH (or "1"), then the switch $30_0$ may couple the resistor $35_0$ to the voltage $V_H$, such as 1 volt. On the other hand, if the control signal $c_o$ is LOW (or "0"), then the switch $30_0$ may couple the resistor $35_0$ to the voltage $V_L$, such as 0 volts.

Further, the switch $30_1$ may be coupled at one end to the resistor $35_1$ and may switch between the voltage $V_H$ or the voltage $V_L$ based on the control signal $c_1$. For example, if the control signal $c_1$ is HIGH (or "1"), then the switch $30_1$ may couple the resistor $35_1$ to the voltage $V_H$. On the other hand, if the control signal $c_1$ is LOW (or "0"), then the switch $30_1$ may couple the resistor $35_1$ to the voltage $V_L$.

Even still further, the switch $30_{n-1}$ may be coupled at one end to the resistor $35_{n-1}$ and may switch between either the voltage $V_H$ or the voltage $V_L$ based on the control signal $c_1$. For example, if the control signal $c_1$ is HIGH (or "1"), then the switch $30_{n-1}$ may couple the resistor $35_{n-1}$ to the voltage $V_H$. On the other hand, if the control signal $c_{n-1}$ is LOW (or "0"), then the switch $30_{n-1}$ may couple the resistor $35_{n-1}$ to the voltage $V_L$. Although not shown in FIG. 3, other switch-resistor implementations may also be provided.

The weighted-sum circuit shown in FIG. 3 includes switch-resistor implementations in order to provide the output analog signal $V_x$ at an output node 38. A comparator circuit (such as the comparator circuit 20 shown in FIG. 1) may be coupled to the output node 38 to generate the PWM signal Px. The comparator circuit is not shown in FIG. 3 for ease of illustration. Additional weighted-sum circuits may also be provided in a switch-resistor implementation to generate different phased signals and/or different types of signals.

Figure 4:
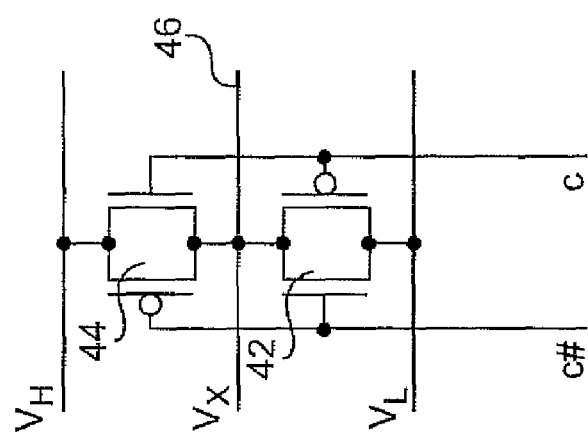
FIG. 4 shows part of a weighted-sum circuit according to an example embodiment of the present invention.

FIG. 4 shows part of a weighted-sum circuit according to an example embodiment of the present invention. Other embodiments and configurations are also within the scope of the present invention. The part of the weighted-sum circuit shown in FIG. 4 may correspond to one column (of the switch-resistor implementation) shown in FIG. 3. More specifically, FIG. 4 shows a first transmission gate 42 and a second transmission gate 44 coupled to two control signal lines. The first control signal line may receive the control signal c and the second control signal line may receive the control signal c#. The control signal c and control signal c# are differential signals received from delay circuits, such as the delay circuits discussed above.

The first transmission gate 42 may include two transistors with a gate of a first transistor coupled to the first control signal line and a gate of a second transistor coupled to the second control signal line. The first transmission gate 42 may be coupled between the voltage $V_L$ and an output signal line 46 (to provide the output analog signal Vx). Additionally, the transmission gate 44 may include two transistors with a gate of a first transistor coupled to the first control signal line and a gate of the second transistor coupled to the second control signal line. The second transmission gate 44 may be coupled between the voltage $V_H$ and the output signal line 46 (to provide the output analog signal Vx). The transmission gates 42 and 44 may implement one switch-resistor implementation such as described above with respect to FIG. 3. The transmission gates 42 and 44 contribute to the output analog signal Vx on the output signal line 46.

Figure 5:
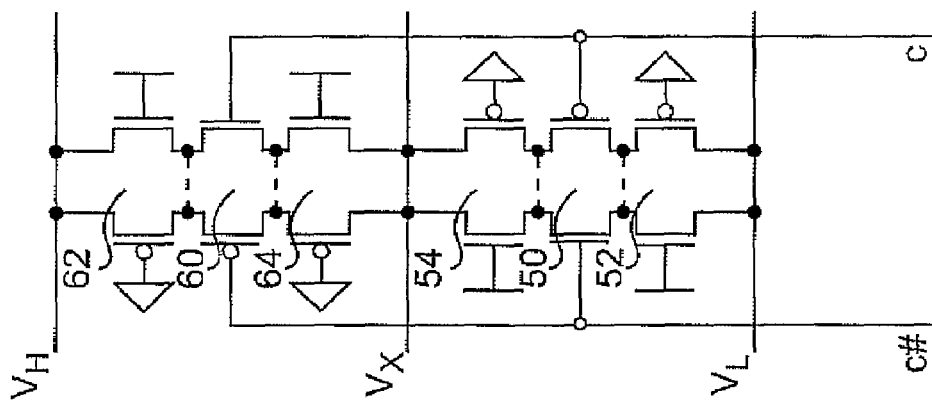
FIG. 5 shows part of a weighted-sum circuit according to an example embodiment of the present invention.

FIG. 5 shows part of a weighted-sum circuit according to an example embodiment of the present invention. Other embodiments and configurations are also within the scope of the present invention. The part of the weighted-sum circuit shown in FIG. 5 may correspond to one column (of the switch-resistor implementation) shown in FIG. 3. More specifically, FIG. 5 shows a plurality of transistors and a plurality of transmission gates coupled in series between two control signal lines (corresponding to the differential control signals c and c#). FIG. 5 shows a switch-resistor implementation such as described above with respect to FIG. 3.

More specifically, FIG. 5 shows a first set of transistors 50 in which a gate of a first transistor is coupled to the first control signal line (corresponding to control signal c) and a gate of a second transistor is coupled to the second control signal line (corresponding to control signal c#). FIG. 5 also shows a second set of transistors 60 in which a gate of a first transistor is coupled to the first control signal line and a gate of a second transistor is coupled to the second control signal line.

Additionally, FIG. 5 shows a first set of transmission gates 52 having two transistors in which a gate of a first transistor is coupled to a supply voltage and a gate of a second transistor is coupled to GROUND. Still further, FIG. 5 shows a second set of transmission gates 54 having two transistors in which a gate of a first transistor is coupled to the supply voltage and a gate of a second transistor is coupled to GROUND.

FIG. 5 also shows a third set of transmission gates 62 having two transistors in which a gate of a first transistor is coupled to the supply voltage and a gate of a second transistor is coupled to GROUND. FIG. 5 also shows a fourth set of transmission gates 64 having two transistors in which a gate of a first transistor is coupled to the supply voltage and a gate of a second transistor is coupled to GROUND.

The first and second sets of transistors 50 and 60 may have a small or minimum gate length whereas the first and third sets of transmission gates 52 and 62 may have longer channel lengths to increase resistance. Accordingly, the first and third sets of transmission gates 52 and 62 may control a resistance value, such as a resistance value corresponding to one of the resistors $35_0, 35_1, \ldots, 35_{n-1}$ shown in FIG. 3. The second and fourth sets of transmission gates 54 and 64 may have a longer channel length to provide a parasitic capacitance and resistance to create a smooth signal (or waveform) and reduce and/or prevent staircasing of the output analog signal Vx.

Figure 6:
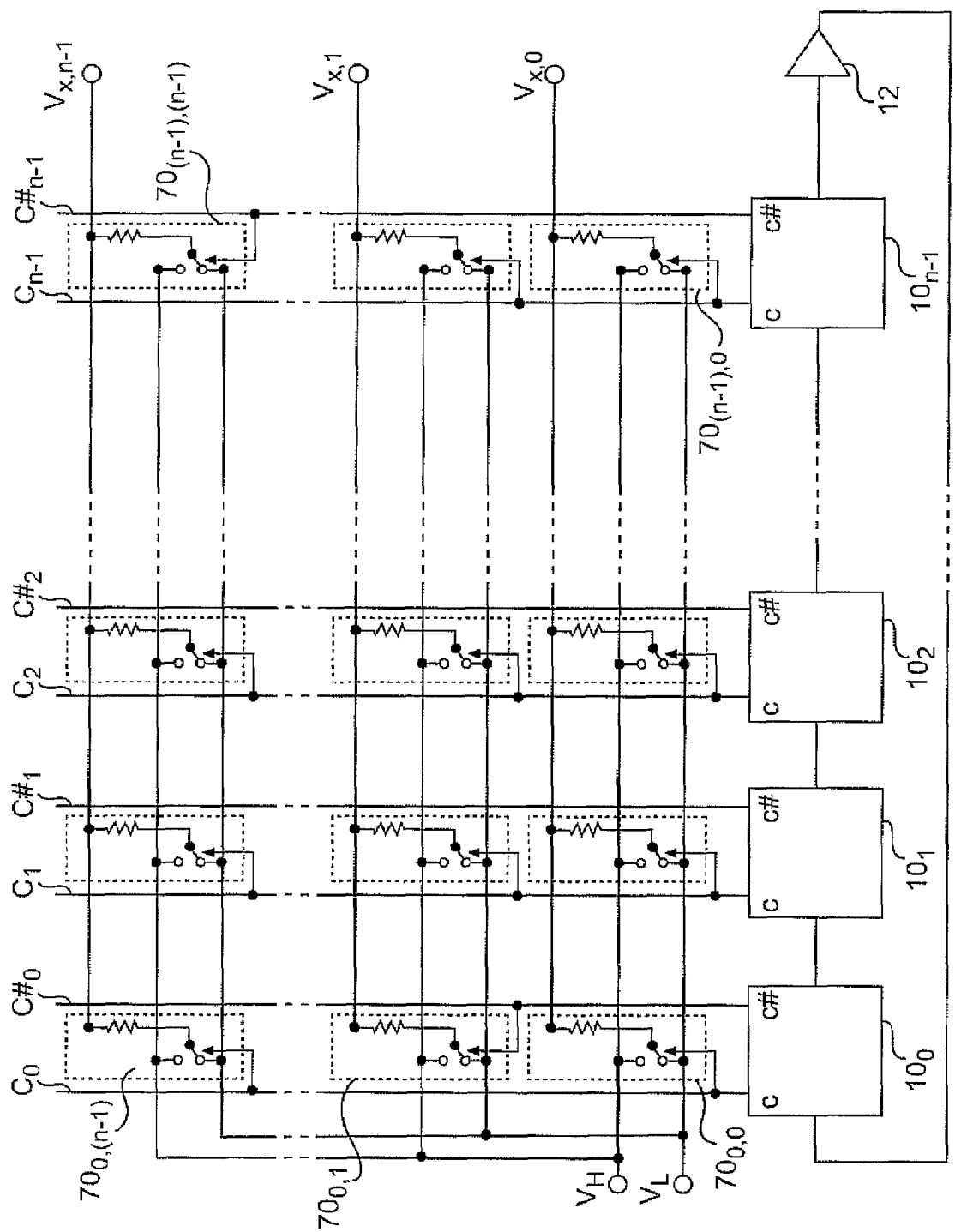
FIG. 6 shows a signal generating circuit according to an example embodiment of the present invention.

FIG. 6 shows a signal generating circuit according to an example embodiment of the present invention. Other embodiments and configurations are also within the scope of the present invention. More specifically, FIG. 6 shows an array of switch-resistor implementations coupled to a ring oscillator so as to form a signal generating circuit. The array of switch-resistor includes a plurality of columns of switch-resistor implementations (or switch-resistor combinations) and a plurality of rows of switch-resistor implementations (or switch-resistor combinations). The switch-resistor implementations shown in FIG. 6 may correspond to the switch-resistor implementations discussed above. Each column of the array may be coupled to (and associated with) a separate one of the delay circuits $10_0, 10_1, 10_2, \ldots, 10_{n-1}$. Additionally, each row of the array may provide a separate one of the output analog signals $V_{x,0}, V_{x,1}, \ldots, V_{x,(n-1)}$. The output analog signals may have different phase offsets from one another, may be different types of signals and/or may be a combination of different types of signals and include phase offsets.

In order to achieve phase offset, various ones of the switch-resistor implementations may have inverted control signals as compared to the other control signals. For example, FIG. 6 shows that switch-resistor implementations $70_{0,0}, 70_{0,1}, \ldots,$ and $70_{0,(n-1)}$ are provided in a column corresponding to the delay circuit $10_0$. Switch-resistor implementations $70_{n-1,0}, 70_{n-1,1}, \ldots,$ and $70_{(n-1),(n-1)}$ are provided in a column corresponding to the delay circuit $10_{n-1}$. The switch-resistor implementations $70_{0,0}$ thru $70_{(n-1),0}$ may receive the control signals $c_0$ thru $c_{n-1}$ to control the respective switches and provide the output analog signal $V_{x,0}$ on the corresponding row. However, to obtain a phase-shifted output analog signal as a different output, the switch-resistor implementation $70_{0,1}$ may receive the control signal $c\#_0$ (rather than $c_0$) to control the respective switch and provide the output analog signal $V_{x,1}$. The phase shift in degrees is 360/2n. To achieve a larger phase shift of k(360/2n), control signals $c\#_0, c\#_1, \ldots, c\#_k$ may be applied instead of $c_0, c_1, \ldots, c_k$. For k>n the switches are controlled by the signals $c_0, c_1, \ldots, c_{k-n}, c\#_{k-n+1}, \ldots, c\#_{n-1}$.

Figure 7:
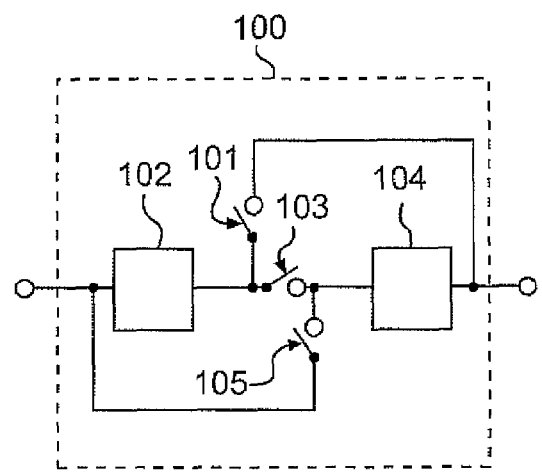
FIG. 7 shows a delay circuit according to an example embodiment of the present invention.

FIG. 7 shows a delay circuit according to an example embodiment of the present invention. Other embodiments and configurations are also within the scope of the present invention. More specifically, FIG. 7 shows a configurable delay circuit 100 that includes a configurable delay to control a delay of signals passing through the delay circuit or being output from the delay circuit. The delay circuit 100 shown in FIG. 7 may correspond to one of the delay circuits discussed above with respect to FIGS. 1-3.

The delay circuit 100 may include two delay circuits 102, 104 and three switches 101, 103 and 105, for example. The switches 101, 103 and 105 may be controlled by a differential signal pair s, s#, for example. The signal pair s, s# may be provided from a device external to the ring oscillator, such as from a control device to control a speed of the ring oscillator.

In the example shown in FIG. 7, the switches 101 and 105 may be controlled by the signal s, and the switch 103 may be controlled by the signal s#. For example, if the signal s=0 (i.e., s#=1), then the switch 103 will be closed and an output node of the delay circuit 102 will be coupled to an input node of delay circuit 104. The delay circuit 102 will therefore be coupled in series with the delay circuit 104. On the other hand, when signal s=1 (s#=0), then the switches 101 and 105 will be closed and the output node of the delay circuit 102 will be coupled to an output node of the delay circuit 104 and the input node of the delay circuit 104 will be directly coupled to an input node of the delay circuit 100 (and an input node of the delay circuit 102). The delay circuit 102 will therefore be coupled in parallel to the delay circuit 104. The delay of the delay circuit 100 may therefore be half of the delay as compared to when the delay circuits 102 and 104 are coupled in series.

Figure 8:
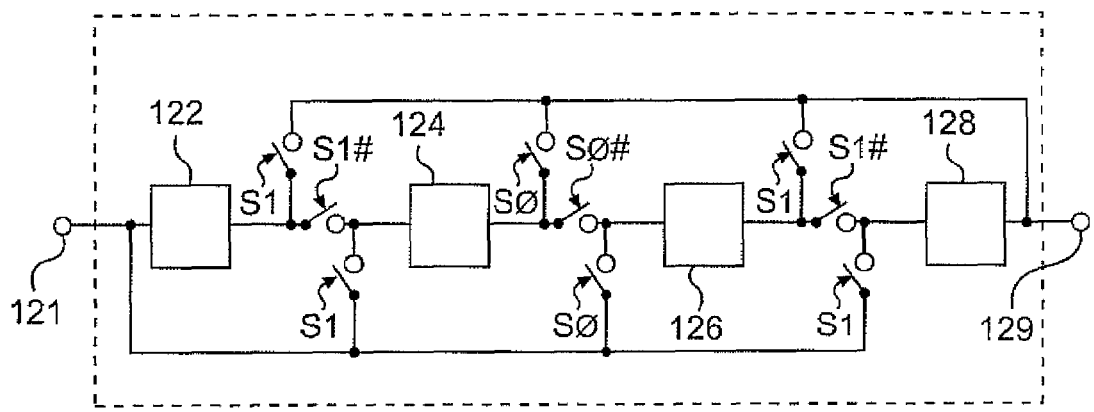
FIG. 8 shows a delay circuit according to an example embodiment of the present invention.

FIG. 8 shows a delay circuit configuration according to an example embodiment of the present invention. Other embodiments and configurations are also within the scope of the present invention. More specifically, FIG. 8 shows four delay circuits 122, 124, 126, 128 and three sets of switches controlled by signal pairs s0, s0# and s1, s1#. The signal pairs s0, s0# and s1, s1# may be provided from a source external to the ring oscillator.

For ease of illustration, FIG. 8 shows the switches labeled by the signals that control the respective switches. For example, when signal s1=0 and signal s0=0 (and thus s0# and s1# are both 1), then the delay circuits 122, 124, 126, 128 are coupled in series between input node 121 and output node 129. This may be considered a 1.0 speed-up factor. On the other hand, when signal s1=0 and signal s0=1 (and thus s0#=0 and s1#=1), then the delay circuits 122 and 124 are coupled in series, the delay cells 126 and 128 are coupled in series, and the delay circuits 122, 124 are coupled in parallel to the delay circuits 126, 128 between the input node 121 and the output node 129. This may be considered a 2.0 speed-up factor. Even further, when signal s1=1 and signal s0=1 (and thus s0#=0 and s1#=0), then all four of the delay circuits 122, 124, 126, 128 are coupled in parallel. This may be considered a speed-up factor of 4.0.

Figure 9:
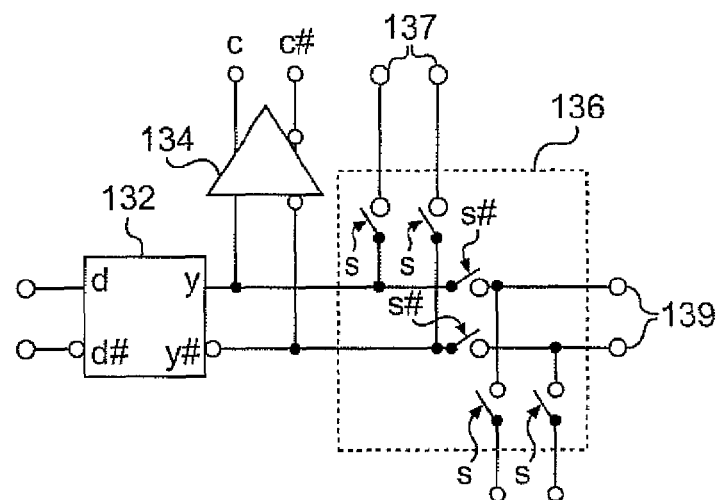
FIG. 9 shows a delay circuit according to an example embodiment of the present invention.

FIG. 9 shows a differential delay circuit according to an example embodiment of the present invention. Other embodiments and configurations are also within the scope of the present invention. The differential delay circuit shown in FIG. 9 may be a differential circuit that corresponds to one of the delay circuits discussed above.

More specifically, FIG. 9 shows a differential delay circuit 132, a differential buffer 134, and a set of differential switches 136 controlled by the signal pair s, s#. For a differential configuration, differential signals may be applied to differential inputs (d and d#) of the delay circuit 132. As one example, the input d may correspond to the input at the input node 121 in FIG. 8 and the input d# is a differential of the input d. The delay circuit 132 may provide differential outputs (y and y#). As one example, the output y may correspond to the output at the output node 129 in FIG. 8 and the output y# is a differential of the output y.

The differential buffer 134 may provide differential control signals (such as the control signals c and c#) based on the differential outputs of the delay circuit 132. The control signals c, c# may be applied to switch-resistor implementations, transistors and/or coefficient circuits as discussed above in order to generate the output analog signal Vx and the PWM signal Px. Additionally, the set of switches 136 may operate based on the differential signals d, d# and the switch pair s, s#, and the set of switches 136 may provide differential outputs 137, 139 based on the differential outputs y, y# of the delay circuit 132.

Figure 10:
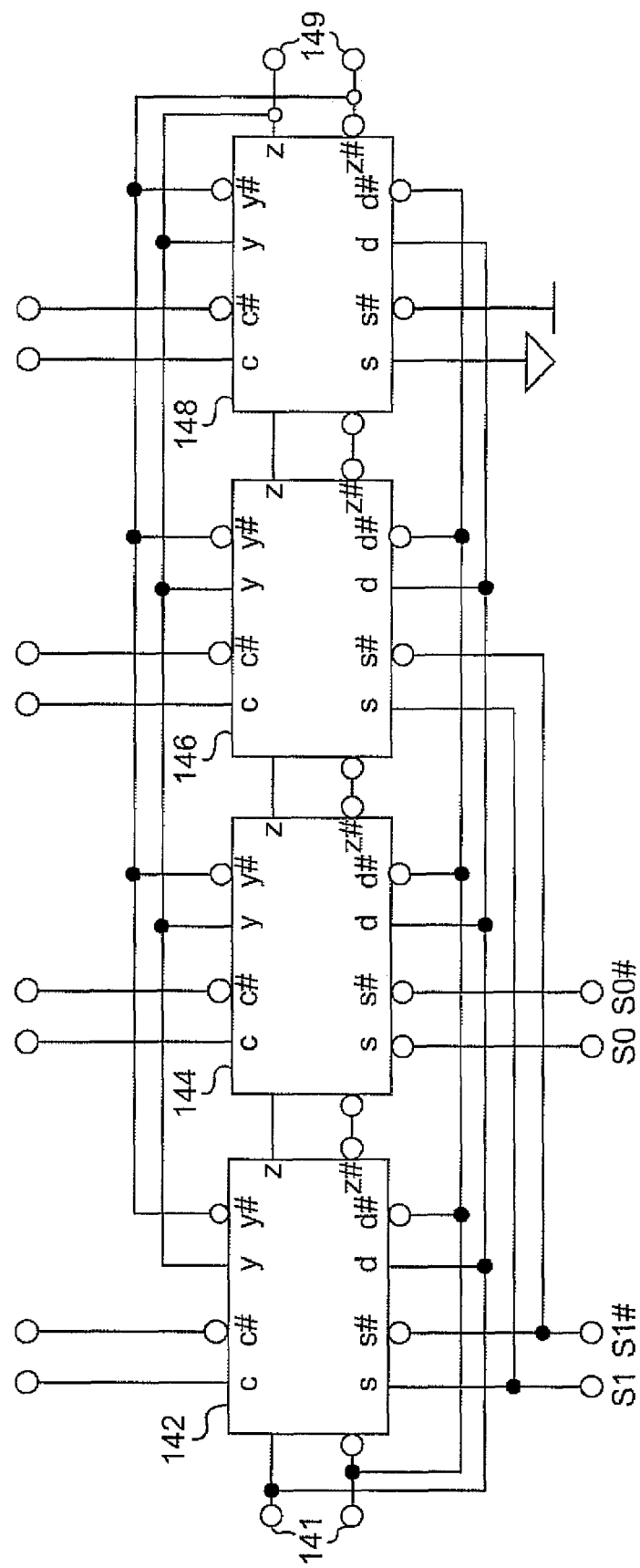
FIG. 10 shows a differential delay circuit configuration according to an example embodiment of the present invention.

FIG. 10 shows a differential delay circuit configuration according to an example embodiment of the present invention. Other embodiments and configurations are also within the scope of the present invention. More specifically, FIG. 10 shows differential delay circuits 142, 144, 146 and 148 coupled in series between input nodes 141 and output nodes 149. Each of the delay circuits 142, 144, 146 and 148 may correspond to the differential delay circuit shown in FIG. 9. The FIG. 10 configuration may have speed-up factors of 1.0, 2.0 and 4.0, for example. As shown, each of the delay circuits 142, 144, 146, 148 may provide control signals c and c#. These control signals c, c# may be applied to switch-resistor implementations, transistors and/or coefficient circuits as discussed above in order to generate the output analog signal Vx and the PWM signal Px.

In FIG. 10, various inputs/outputs are labeled for each of the delay circuits 142, 144, 146, 148. For example, the differential outputs y, y# shown in FIG. 10 may correspond to the differential outputs 137 of the differential switches 136 shown in FIG. 9. Additionally, the differential outputs z, z# shown in FIG. 10 may correspond to the differential outputs 139 of the differential switches 136 shown in FIG. 9. Still further, the differential inputs d, d# shown in FIG. 10 may correspond to inputs of the differential switches 136 shown in FIG. 9.

Other delay circuit configurations may also be provided. For example, an example embodiment may use an even number of configurable delay circuits coupled in series, an inverting circuit, and a feedback loop to form the ring oscillator. Still another example embodiment may use an even number of configurable delay circuits coupled in series, a start-up circuit, and a feedback loop to form the ring oscillator.

Figure 11:
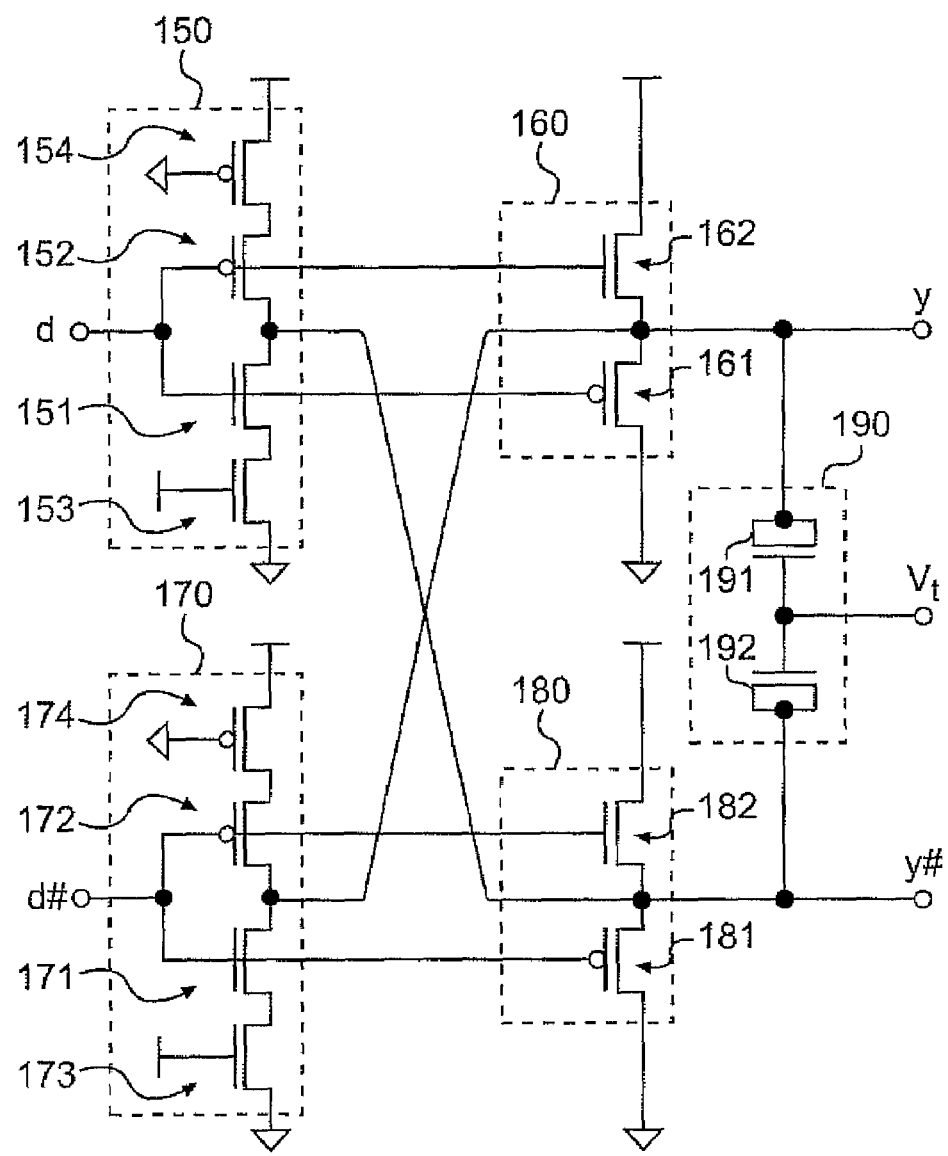
FIG. 11 shows a differential delay circuit according to an example embodiment of the present invention.

FIG. 11 shows a differential delay circuit according to an example embodiment of the present invention. Other embodiments and configurations are also within the scope of the present invention. The differential delay circuit shown in FIG. 11 may correspond to the differential delay cell 132 shown in FIG. 9.

FIG. 11 shows two inverter circuits 150, 170, two follower circuits 160, 180 and a varactor pair 190. The follower circuits 160, 180 may limit skew between the two differential delay paths (shown as y and y#). The delay paths y, y# may correspond to the differential outputs 137 shown in FIG. 9.

The inverter circuit 150 may include transistors 151-154. The transistors 153, 154 may have relatively long channels to keep a drive strength at a controlled low value, and the transistors 151, 152 may have short channel length to minimize input parasitic capacitance.

The follower circuit 170 may include two transistors 161 and 162. The transistors 161, 162 may have relatively long channels so that an output (i.e., delay path y) is mainly determined by the inverter circuits 150 and 170. The transistors 161, 162 may also be replaced by short-channel devices in series with longer-channel devices.

The inverter circuit 170 may include transistors 171-174. The transistors 173, 174 may also have relatively long channels to keep a drive strength at a controlled low value, and the transistors 171, 172 may have short channel length to minimize input parasitic capacitance.

Still further, the follower circuit 180 may include two transistors 181 and 182. The transistors 181, 182 may have relatively long channels so that an output is mainly determined by the inverter circuits 150, 170. The transistors 181, 182 may also be replaced by short-channel devices in series with longer-channel devices.

The varactor 190 may include two large (long and wide) transistors 191, 192 to adjust the delays on the delay paths y and y# based on the voltage Vt.

Figure 12:
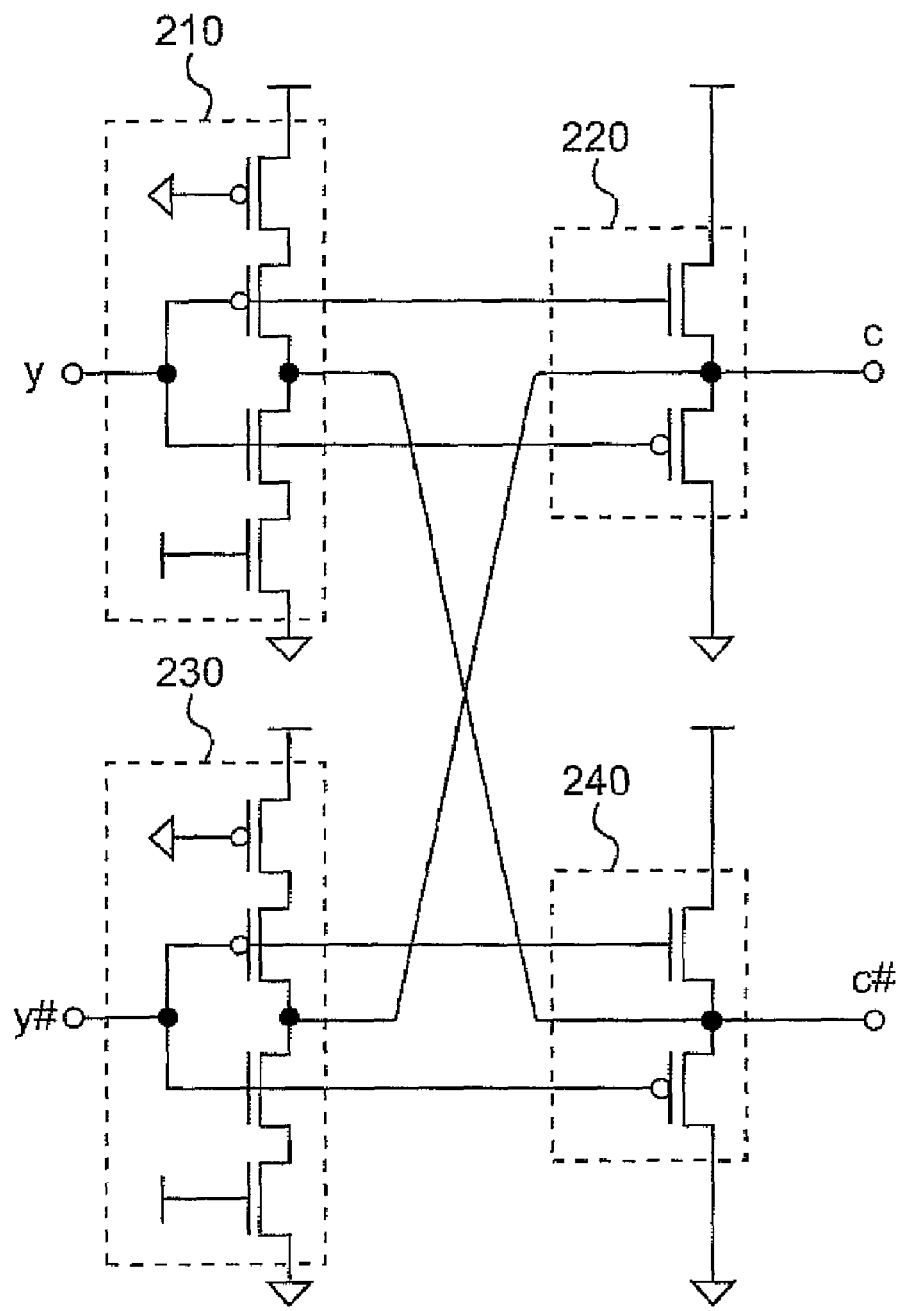
FIG. 12 shows a differential buffer circuit according to an example embodiment of the present invention.

FIG. 12 shows a differential buffer circuit according to an example embodiment of the present embodiment. Other embodiments and configurations are also within the scope of the present invention. The differential buffer circuit shown in FIG. 12 may correspond to the differential buffer 134 shown in FIG. 9.

FIG. 12 shows a differential buffer circuit to drive control signals c, c# and to prevent additional loading of the input signals y, y#. The differential buffer circuit may provide a controlled slew rate for the control signals c, c#. More specifically, the differential buffer circuit may include a pair of inverter circuits 210, 230 and a pair of follower circuits 220, 240. The follower circuits 220, 240 provide most of the current to drive signals c, c# at approximately the same slew rate as the input signals y, y#. The inverter circuits 210, 230 are weaker and ensure that signals c, c# are full-swing (i.e., c, c# reach ground or supply completely).

Figure 13:
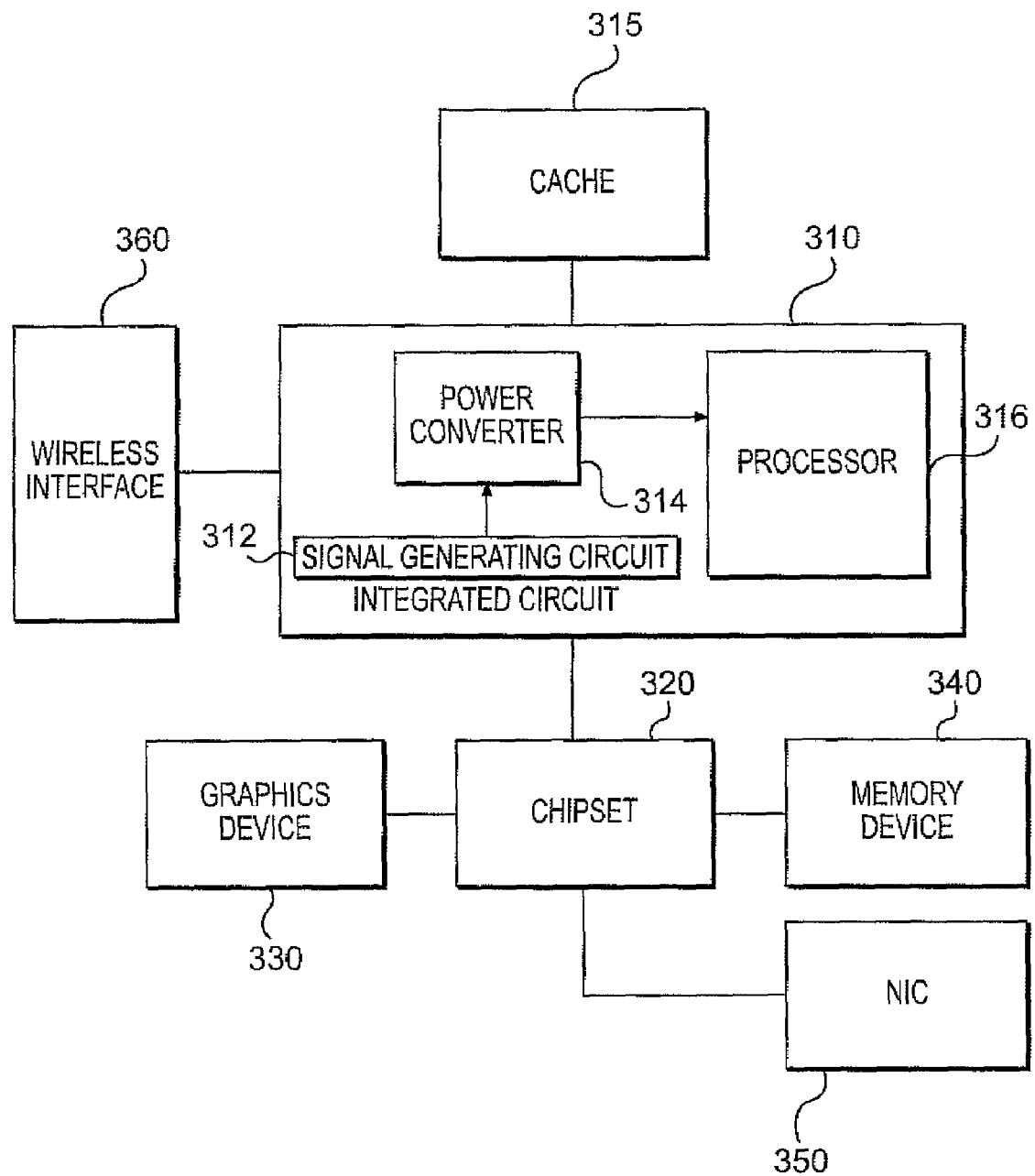
FIG. 13 is a block diagram of a system according to an example embodiment of the present invention.

FIG. 13 is a block diagram of a system (such as a computer system 300) according to an example embodiment of the present invention. Other embodiments and configurations are also within the scope of the present invention. More specifically, the computer system 300 may include an integrated circuit 310 that may have a signal generating circuit 312, a power converter 314 and a processor 316. The signal generating circuit 312 may correspond to any one of the signal generating circuit discussed above. The signal generating circuit 312 may provide the PWM signal (Px) to the power converter 314. The power converter 314 may be a DC-to-DC power converter to supply current and/or voltage to the processor 316. The integrated circuit 310 may communicate to a cache 315 (or memory) and/or to a chipset 320. The chipset 320 may be further coupled to a graphics device 330, a memory device 340 and a network interface controller (NIC) 350. The integrated circuit 310 may be further coupled to a wireless interface 360 to interface the system 300 with other systems, networks, and/or devices via a wireless connection such as an antenna. The wireless interface 360 may link the processor 310 to a wireless network Embodiments of the present invention may be provided in or for multiphase and/or multi-output integrated DC-to-DC converters that switch at frequencies of up to several 100 MHz.

Systems represented by the various foregoing figures can be of any type. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the present invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A signal generating circuit comprising:
   a ring oscillator having a plurality of delay circuits coupled in series, each delay circuit to provide a control signal; and
   a weighted-sum circuit to receive an offset voltage and the plurality of control signals and to provide an output analog signal, and the weighted-sum circuit includes a plurality of switch-resistor implementations.

2. The signal generating circuit of claim 1, further comprising a comparator to compare the output analog signal with a threshold voltage and to provide a pulse width modulated (PWM) signal.

3. A signal generating circuit comprising:
   a ring oscillator having a plurality of delay circuits coupled in series, each delay circuit to provide a control signal; and
   a weighted-sum circuit to receive an offset voltage and the plurality of control signals and to provide an output analog signal, and the output analog signal comprises a triangular signal.

4. The signal generating circuit of claim 1, wherein the output analog signal comprises a sinusoidal signal.

5. The signal generating circuit of claim 1, wherein the weighted-sum circuit includes a first weighted-sum circuit to provide a first output analog signal and a second weighted-sum circuit to provide a second output analog signal.

6. The signal generating circuit of claim 5, wherein the second output analog signal is phase-shifted from the first output analog signal.

7. The signal generating circuit of claim 5, wherein the second output analog signal is a different type of signal than the first output analog signal.

8. The signal generating circuit of claim 3, wherein the weighted-sum circuit comprises a plurality of switch-resistor implementations.

9. The signal generating circuit of claim 1, wherein each of the switch-resistor implementations receives a separate one of the plurality of the control signals from the ring oscillator.

10. The signal generating circuit of claim 1, wherein the ring oscillator includes a plurality of switches between each of the delay circuits.

11. The signal generating circuit of claim 10, wherein each of the delay circuits is a configurable delay circuit, and the switches control a speed of the ring oscillator.

12. A signal generating circuit comprising:
    a plurality of delay circuits coupled to provide a plurality of control signals;
    a weighted-sum circuit to receive the plurality of control signals and to provide an output analog signal; and
    a comparator circuit to compare the output analog signal with a voltage and to provide a pulse width modulated (PWM) signal based on the comparison.

13. The signal generating circuit of claim 12, wherein the output analog signal comprises a periodic signal.

14. The signal generating circuit of claim 12, wherein the weighted-sum circuit includes a first weighted-sum circuit to provide a first output analog signal and a second weighted-sum circuit to provide a second output analog signal.

15. The signal generating circuit of claim 14, wherein the second output analog signal is phase-shifted from the first output analog signal.

16. The signal generating circuit of claim 14, wherein the second output analog signal is a different type of signal than the first output analog signal.

17. The signal generating circuit of claim 12, wherein the delay circuits comprise configurable delay circuits.

18. The signal generating circuit of claim 17, further comprising switches to control speed of the plurality of delay circuits.

19. A system comprising:
    a processor;
    a signal generating circuit to generate a pulse width modulated signal;
    a power converter circuit to receive the pulse width modulated signal and provide a signal to the processor; and
    a wireless interface to link the processor to a wireless network, the signal generating circuit including:

a ring oscillator having a plurality of delay circuits to provide a plurality of control signals; and a weighted-sum circuit to receive the plurality of control signals and to provide an output analog signal.

20. The system of claim 19, the signal generating circuit further including a comparator to compare the output analog signal with a threshold voltage and to provide a pulse width modulated (PWM) signal based on the comparison.

21. The system of claim 19, wherein the weighted-sum circuit includes a first weighted-sum circuit to provide a first output analog signal and a second weighted-sum circuit to provide a second output analog signal.

22. The system of claim 21, wherein the second output analog signal is phase-shifted from the first output analog signal.

23. The system of claim 21, wherein the second output analog signal is a different type of signal than the first output analog signal.

* * * * *